(12) United States Patent
Liu

(10) Patent No.: US 12,176,355 B2
(45) Date of Patent: Dec. 24, 2024

(54) DISPLAY PANEL AND MANUFACTURING METHOD THEREOF

(71) Applicant: TCL CHINA STAR OPTOELECTRONICS TECHNOLOGY CO., LTD., Shenzhen (CN)

(72) Inventor: Jing Liu, Shenzhen (CN)

(73) Assignee: TCL CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 274 days.

(21) Appl. No.: 17/781,033

(22) PCT Filed: May 20, 2022

(86) PCT No.: PCT/CN2022/094019
§ 371 (c)(1),
(2) Date: May 30, 2022

(87) PCT Pub. No.: WO2023/216297
PCT Pub. Date: Nov. 16, 2023

(65) Prior Publication Data
US 2023/0369353 A1    Nov. 16, 2023

(30) Foreign Application Priority Data
May 11, 2022   (CN) .......................... 202210512865.0

(51) Int. Cl.
*H01L 27/12*    (2006.01)
*G02F 1/1368*   (2006.01)

(52) U.S. Cl.
CPC ........ *H01L 27/1255* (2013.01); *G02F 1/1368* (2013.01); *H01L 27/127* (2013.01)

(58) Field of Classification Search
CPC ............. G02F 1/1368; G02F 1/136213; H01L 27/1255; H01L 27/127
See application file for complete search history.

(56) References Cited

U.S. PATENT DOCUMENTS

2018/0204855 A1* 7/2018 Yamazaki ........... H01L 29/7869

FOREIGN PATENT DOCUMENTS

| CN | 1591144 A | 3/2005 |
|----|-----------|--------|
| CN | 1797159 A | 7/2006 |

(Continued)

OTHER PUBLICATIONS

Chinese Office Action issued in corresponding Chinese Patent Application No. 202210512865.0 dated Apr. 27, 2023, pp. 1-9, 18pp.

(Continued)

*Primary Examiner* — James A Dudek
(74) *Attorney, Agent, or Firm* — The Roy Gross Law Firm, LLC; Roy Gross

(57) ABSTRACT

Embodiments of the present disclosure are directed to a display panel and a manufacturing method thereof, which includes a plurality of first electrode plates and a plurality of second electrode plates, and one of the second electrodes plate is disposed corresponding to one of the first electrode plates; each of the second electrode plates includes a first additional conductive sublayer, a first semiconductor sublayer, and a first metal sublayer stacked, and the first metal sublayer is electrically connected with the first additional conductive sublayer.

16 Claims, 5 Drawing Sheets

(56) References Cited

FOREIGN PATENT DOCUMENTS

| | | | |
|---|---|---|---|
| CN | 202957245 | U | 5/2013 |
| CN | 105161544 | A | 12/2015 |
| CN | 105470269 | A | 4/2016 |
| CN | 109037350 | A | 12/2018 |
| CN | 113394166 | A | 9/2021 |
| CN | 113467145 | A | 10/2021 |
| JP | 2000194012 | A | 7/2000 |
| WO | 2016150082 | A1 | 9/2016 |

OTHER PUBLICATIONS

PCT International Search Report for International Application No. PCT/CN2022/094019, mailed on Nov. 28, 2022, 10pp.
PCT Written Opinion of the International Search Authority for International Application No. PCT/CN2022/094019, mailed on Nov. 28, 2022, 9pp.

\* cited by examiner

DISPLAY PANEL AND MANUFACTURING METHOD THEREOF

This application is a National Phase of PCT Patent Application No. PCT/CN2022/094019 having International filing date of May 20, 2022, which claims the benefit of priority of Chinese Application No. 202210512865.0, filed May 11, 2022, the contents of which are all incorporated herein by reference in their entirety.

FIELD OF THE INVENTION

The present disclosure relates to the field of display technology, more particularly, to a display panel and a manufacturing method thereof.

BACKGROUND

A liquid crystal display (LCD) includes an array substrate, a color film substrate, and a liquid crystal layer sandwiched between the color film substrate and the array substrate. The array substrate includes a gate line, a data line, a pixel electrode, and a thin film transistor (TFT). The mutually perpendicular gate lines and data lines define the pixel area. The thin film transistor and the pixel electrode are formed in the pixel area. The gate line is used to provide the turning-on signal to the thin film transistor, and the data line is used to provide the data signal to the pixel electrode. The grayscale display is realized by controlling the deflection degree of the liquid crystal.

In the existing LCD monitors, in order to reduce the cost and simplify the process, the 4Mask process is often used to prepare the LCD monitors, which specifically includes forming a gate and a lower electrode plate on a substrate, forming a gate insulation layer to cover the gate and the lower electrode plate, depositing a semiconductor layer and a metal layer on the gate insulation layer in turn, and then using a photomask process to etch to form a source-drain and an active layer, and a data line and an upper electrode plate connected to the data line are formed at the same time, and the upper electrode plate is located above the lower electrode plate to form a storage capacitor structure.

However, the upper electrode plate and the data line formed in the 4Mask process mentioned above are the stacked structure of the semiconductor layer with the metal layer, and then when capacitance is formed between the upper electrode plate and the lower electrode plate, there is a semiconductor layer disposed between the metal layer and the lower electrode plate to separate. When the positive and negative polarity of the metal layer changes, the electrical property of the semiconductor layer changes, thereby causing the voltage of the lower electrode plate to fluctuate and affecting the stability of the storage capacitor, and then the signal crosstalk is easy to occur.

SUMMARY

Technical Problem

Embodiments of the present disclosure are directed to a display panel and a manufacturing method, which are capable of improving the stability of the capacitance formed between a first electrode plate and a second electrode plate, thereby improving the stability of signal transmission and the display effect of the display panel.

Technical Solution

According to one embodiment of the present disclosure, a display panel includes a substrate, a first conductive layer and a second conductive layer. The first conductive layer, disposed on one side of the substrate, comprises a first electrode plate. The second conductive layer is disposed on one side of the first conductive layer away from the substrate and arranged at intervals with the first conductive layer. The second conductive layer comprises a second electrode plate corresponding to the first electrode plate. The second electrode plates comprises a first additional conductive sublayer, a first semiconductor sublayer, and a first metal sublayer stacked. The first semiconductor sublayer is disposed on one side of the first additional conductive sublayer away from the first conductive layer. The first metal sublayer is disposed on one side of the first semiconductor sublayer away from the first additional conductive sublayer. The first metal sublayer is connected with the first additional conductive sublayer.

According to one embodiment of the present disclosure, the second conductive layer further comprises a data line. The data line includes a second additional conductive sublayer, a second semiconductor sublayer, and a second metal sublayer. The second semiconductor sublayer is disposed on one side of the second additional conductive sublayer away from the first conductive layer. The second metal sublayer is disposed on one side of the second semiconductor sublayer away from the second additional conductive sublayer, and connected with the second metal sublayer.

According to one embodiment of the present disclosure, the second electrode plate is connected corresponding to the data line. The first additional conductive sublayer of the second electrode plate is connected to the second additional conductive sublayer of the data line. The first semiconductor sublayer of the second electrode plate is connected to the second semiconductor sublayer of the data line. The first metal sublayer of the second electrode plate is connected to the second metal sublayer of the data line.

According to one embodiment of the present disclosure, the display panel further includes a display area and a non-display area adjacent to the display area. The data line is connected to the second electrode plate in the display area and partially extends into the non-display area. The data line further comprises a via that is disposed between the second metal sublayer and the second additional conductive sublayer and located in the non-display area. The second metal sublayer is connected with the second additional conductive sublayer through the via.

According to one embodiment of the present disclosure, a material of the first additional conductive sublayer is the same as a material of the second additional conductive sublayer, a material of the first semiconductor sublayer is the same as a material of the second semiconductor sublayer, and a material of the first metal sublayer is the same as a material of the second metal sublayer.

According to one embodiment of the present disclosure, the second conductive layer further comprises an active layer, a source, and a drain. The active layer includes a third additional conductive sublayer and a third semiconductor sublayer that is disposed on one side of the third additional conductive sublayer away from the first conductive layer. The source is disposed on the active layer. The drain is disposed on the active layer. Each of the source and the drain comprises a third metal sublayer disposed on the third semiconductor sublayer.

According to one embodiment of the present disclosure, the third additional conductive sublayer comprises a first sub portion, a second sub portion, and a trench disposed between the first sub portion and the second sub portion. An orthographic projection of the trench on the substrate is located between an orthographic projection of the source on the substrate and an orthographic projection of the drain on the substrate.

According to one embodiment of the present disclosure, the second metal sublayer of the data line is connected to the third metal sublayer of the source, the second semiconductor sublayer of the data line is connected to the third semiconductor sublayer of the active layer, and the second additional conductive sublayer of the data line is connected to the first portion or the second portion of the active layer.

According to one embodiment of the present disclosure, the first conductive layer further comprises a gate, disposed between the substrate and the second conductive layer. The source, the drain, the active layer are disposed on one side of the gate away from the substrate, and the first electrode plate is relatively disposed with the first additional conductive sublayer.

According to another embodiment of the present disclosure, a method for manufacturing a display panel is provided. The method includes forming a first conductive layer on one side of a substrate where the first conductive layer comprises a first electrode plate, and forming a second conductive layer on one side of the first conductive layer away from the substrate. The first conductive layer, disposed on one side of the substrate, comprises a first electrode plate. The second conductive layer is disposed on one side of the first conductive layer away from the substrate and arranged at intervals with the first conductive layer. The second conductive layer comprises a second electrode plate corresponding to the first electrode plate. The second electrode plates comprises a first additional conductive sublayer, a first semiconductor sublayer, and a first metal sublayer stacked. The first semiconductor sublayer is disposed on one side of the first additional conductive sublayer away from the first conductive layer. The first metal sublayer is disposed on one side of the first semiconductor sublayer away from the first additional conductive sublayer. The first metal sublayer is connected with the first additional conductive sublayer.

According to one embodiment of the present disclosure, the second conductive layer further comprises a data line. The data line includes a second additional conductive sublayer, a second semiconductor sublayer, and a second metal sublayer. The second semiconductor sublayer is disposed on one side of the second additional conductive sublayer away from the first conductive layer. The second metal sublayer is disposed on one side of the second semiconductor sublayer away from the second additional conductive sublayer, and connected with the second metal sublayer.

According to one embodiment of the present disclosure, the second electrode plate is connected corresponding to the data line. The first additional conductive sublayer of the second electrode plate is connected to the second additional conductive sublayer of the data line. The first semiconductor sublayer of the second electrode plate is connected to the second semiconductor sublayer of the data line. The first metal sublayer of the second electrode plate is connected to the second metal sublayer of the data line.

According to one embodiment of the present disclosure, the display panel further includes a display area and a non-display area adjacent to the display area. The data line is connected to the second electrode plate in the display area and partially extends into the non-display area. The data line further comprises a via that is disposed between the second metal sublayer and the second additional conductive sublayer and located in the non-display area. The second metal sublayer is connected with the second additional conductive sublayer through the via.

According to one embodiment of the present disclosure, a material of the first additional conductive sublayer is the same as a material of the second additional conductive sublayer, a material of the first semiconductor sublayer is the same as a material of the second semiconductor sublayer, and a material of the first metal sublayer is the same as a material of the second metal sublayer.

According to one embodiment of the present disclosure, the second conductive layer further comprises an active layer, a source, and a drain. The active layer includes a third additional conductive sublayer and a third semiconductor sublayer that is disposed on one side of the third additional conductive sublayer away from the first conductive layer. The source is disposed on the active layer. The drain is disposed on the active layer. Each of the source and the drain comprises a third metal sublayer disposed on the third semiconductor sublayer.

According to one embodiment of the present disclosure, the third additional conductive sublayer comprises a first sub portion, a second sub portion, and a trench disposed between the first sub portion and the second sub portion. An orthographic projection of the trench on the substrate is located between an orthographic projection of the source on the substrate and an orthographic projection of the drain on the substrate.

According to one embodiment of the present disclosure, the second metal sublayer of the data line is connected to the third metal sublayer of the source, the second semiconductor sublayer of the data line is connected to the third semiconductor sublayer of the active layer, and the second additional conductive sublayer of the data line is connected to the first portion or the second portion of the active layer.

According to one embodiment of the present disclosure, the first conductive layer further comprises a gate, disposed between the substrate and the second conductive layer. The source, the drain, the active layer are disposed on one side of the gate away from the substrate, and the first electrode plate is relatively disposed with the first additional conductive sublayer.

Advantageous Effect

Compared with the prior art, embodiments of the present disclosure are direct to a display panel. The first additional conductive sublayer, on one side of the first semiconductor sublayer of the second electrode plate close to the first conductive layer, is connected with the first metal sublayer. The first additional conductive sublayer can maintain the same potential as the first metal sublayer. The distance between the first electrode plate and the second electrode plate is the same as the distance between the first electrode plate and the first additional conductive sublayer. Because there is no semiconductor layer disposed between the first additional conductive sublayer and the first electrode plate, the capacitance between the first electrode plate and the second electrode plate will not fluctuate due to the change of semiconductor electrical property, improving the signal stability of the capacitance in the display panel, and thereby avoiding the occurrence of signal crosstalk to improve the display effect of the display panel.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF THE EMBODIMENTS

Figure 1:
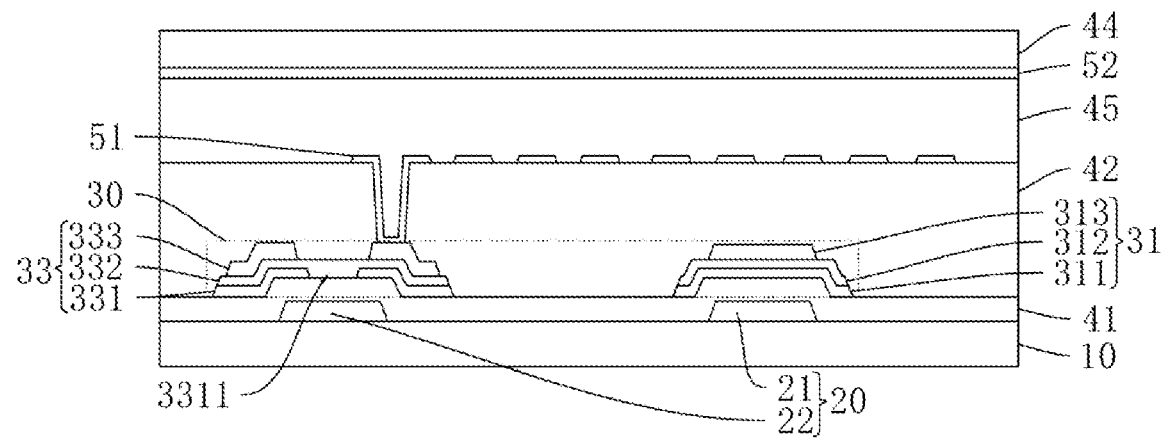
FIG. 1 is a structural diagram of a display panel according to one embodiment of the present disclosure.

The following reference to the accompanying drawings of the present disclosure introduces preferred embodiments of the present disclosure, proving that the present disclosure may be implemented, the embodiment of the invention may be a complete introduction to those skilled in the art of the present disclosure, so that its technical content is more clear and easy to understand. The present disclosure may be embodied by many different forms of embodiments of the present disclosure, the scope of protection of the present disclosure is not limited to the embodiments referred to herein.

The following disclosure provides many different embodiments or examples for implementing different structures of the present disclosure. To simplify the disclosure of the present application, the components and arrangements of specific examples are described below. Of course, they are only examples and are not intended to limit the application. Furthermore, this application may repeat reference numerals and/or reference letters in different instances for the purpose of simplicity and clarity, and does not in itself indicate a relationship between the various embodiments and/or arrangements discussed. In addition, this application provides examples of various specific processes and materials, but one of ordinary skill in the art will recognize the application of other processes and/or the use of other materials.

An embodiment of the present disclosure is directed to a display panel. Please refer to FIG. 1. The display panel comprises a substrate 10, a first conductive layer 20, and a second conductive layer 30.

The first conductive layer 20 which is disposed on one side of the substrate 10 comprises a first electrode plate 21. The second conductive layer 30 is disposed on one side of the first conductive layer 20 away from the substrate 10 and arranged at interval with the first conductive layer 20. The second conductive layer 30 comprises a second electrode plate 31 corresponding to the first electrode plate 21.

The second electrode plate 31 comprises a first additional conductive sublayer 311, a first semiconductor sublayer 312, and a first metal sublayer 313 stacked. The first semiconductor sublayer 312 is disposed on one side of the first additional conductive sublayer 311 away from the first conductive layer 20. The first metal sublayer 313 is disposed on one side of the first semiconductor sublayer 312 away from the first additional conductive sublayer 311, and the first metal sublayer 313 is electrically connected with the first additional conductive sublayer 311.

Figure 2:
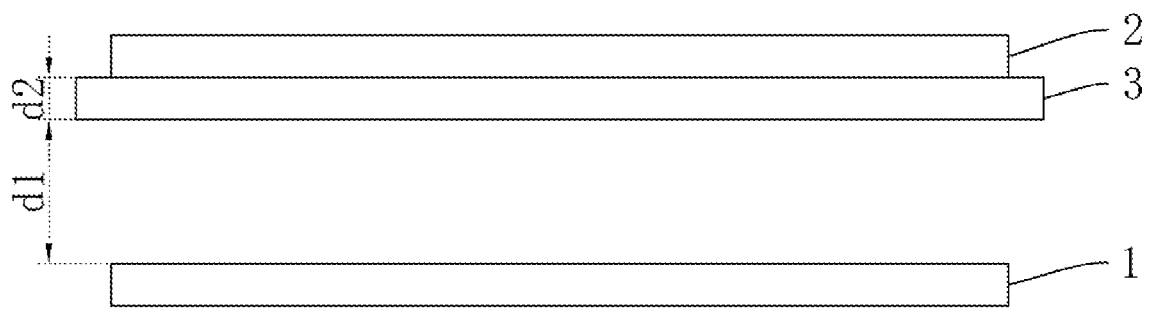
FIG. 2 is a structural diagram of an existing storage capacitor.

Please refer to FIG. 2. A conventional 4-Mask process includes: forming a gate and a lower electrode plate 1 on a substrate, forming a gate insulation layer to cover the gate and the lower electrode plate 1, depositing a semiconductor layer 3 and a metal layer 2 on the gate insulation layer in turn, and using a photomask process to etch to form a source-drain, an active layer, a data line and an upper electrode plate connected to the data line at the same time, where the upper electrode plate is located above the lower electrode plate to form a storage capacitor structure. The upper electrode plate is the stacked structure of the semiconductor layer 3 and the metal layer 2. Specifically, when the electrical signal in the metal layer 2 is positive, the electric field direction is the direction in which the metal layer 2 points to the lower electrode plate 1, and the electrons in the semiconductor layer 3 move in the opposite direction of the electric field direction, that is, to an upper surface close to one side of the metal layer 2. At this time, the side of the semiconductor layer 3 away from the upper surface is regarded as insulation, and the actual upper electrode plate of the storage capacitor is the metal layer 2, so that the distance between the electrode plates of the storage capacitor is the sum of d1 and d2. When the electrical signal in the metal layer 2 is negative, the electric field direction is the direction in which the lower electrode plate 1 points to the metal layer 2, and the electrons in the semiconductor layer 3 move in the opposite direction of the electric field direction, that is, to the lower surface away from one side of the metal layer 2. At this time, the side of the semiconductor layer 3 close to the lower surface is a conductor, and the actual lower electrode plate of the storage capacitor is the semiconductor layer 3, so that the distance between the electrode plates of the storage capacitor is d1. Compared with the positive polarity, the distance between the electrode plates of the storage capacitor becomes smaller, and the capacitance becomes larger. Therefore, when the positive and negative polarity of the electrical signal in the metal layer 2 changes, due to the change of the electrical property of the semiconductor, the capacitance will eventually fluctuate, thereby affecting the signal transmission and causing the phenomenon of crosstalk to affect the display effect.

In one embodiment of the present disclosure, the first additional conductive sublayer 311, on one side of the first semiconductor sublayer 312 of the second electrode plate 31 close to the first conductive layer 20, is connected with the first metal sublayer 313. The first additional conductive sublayer 311 can maintain the same potential as the first metal sublayer 313. The distance between the first electrode plate 21 and the second electrode plate 31 is the same as the distance between the first electrode plate 21 and the first additional conductive sublayer 311. Because there is no semiconductor layer disposed between the first additional conductive sublayer 311 and the first electrode plate 21, the capacitance between the first electrode plate 21 and the second electrode plate 31 will not fluctuate due to the change of semiconductor electrical property, improving the signal stability of the capacitance in the display panel, and thereby avoiding the occurrence of signal crosstalk to improve the display effect of the display panel.

Figure 3:
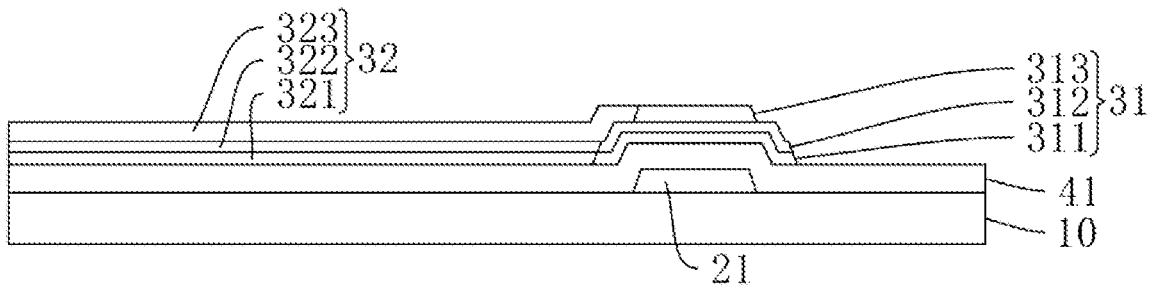
FIG. 3 is a schematic diagram of a connection structure formed between a second electrode plate and a data line according to one embodiment of the present disclosure.
Figure 4:
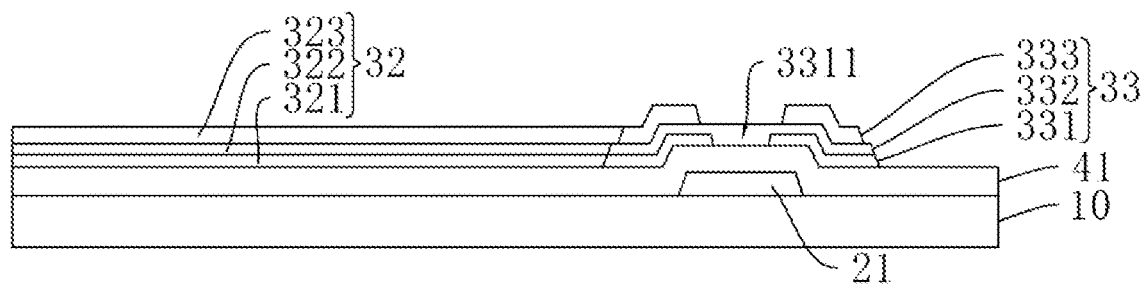
FIG. 4 is a schematic diagram of a connection structure formed between a source and the data line according to one embodiment of the present disclosure.
Figure 5:
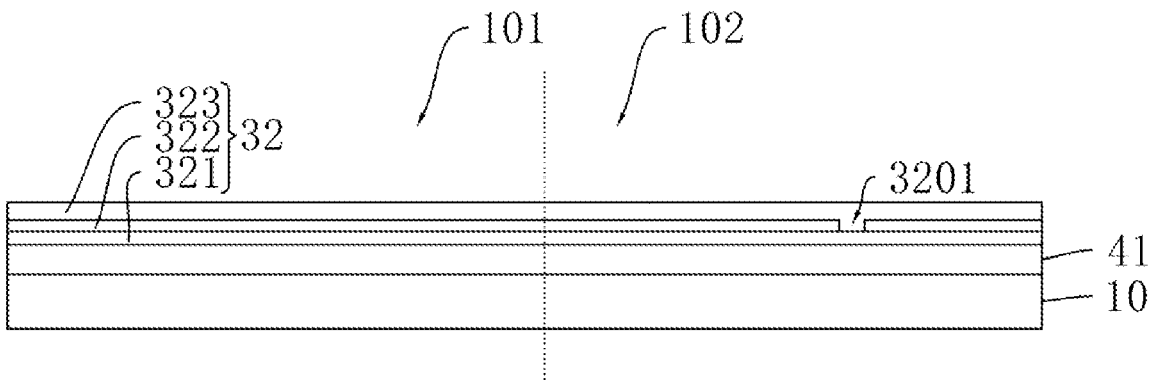
FIG. 5 is a schematic diagram of a connection structure formed between a second metal sublayer and a second additional conductive sublayer according to one embodiment of the present disclosure.
Figure 6:
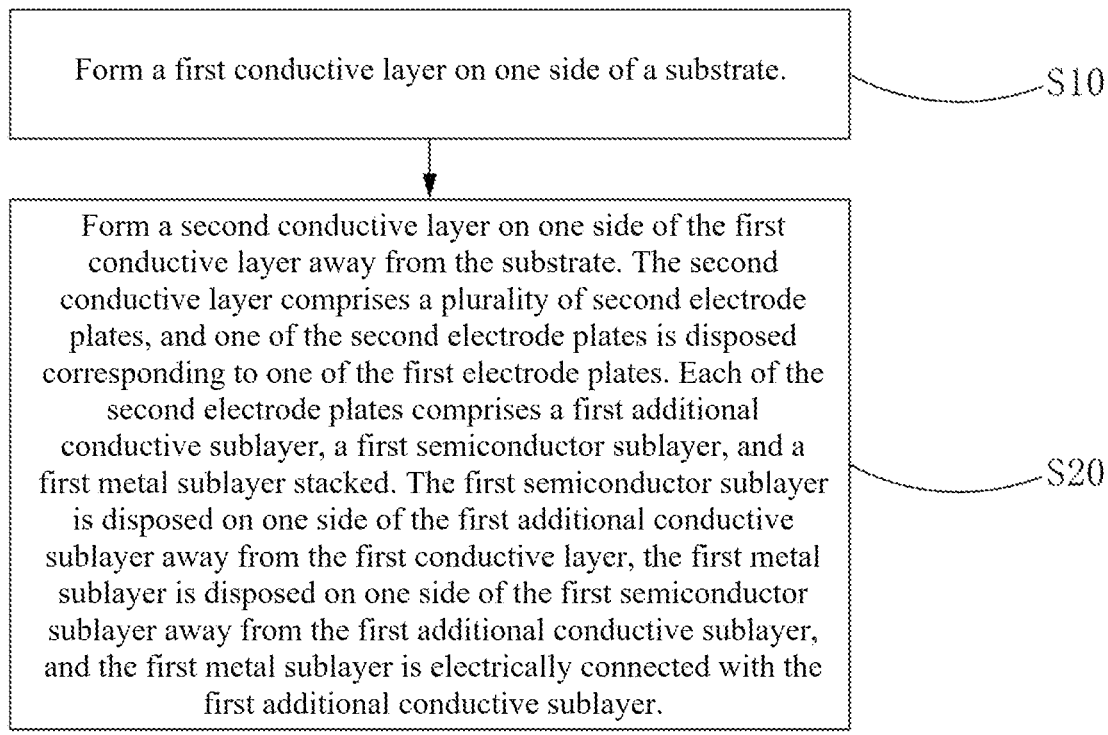
FIG. 6 is a flowchart of a manufacturing method of the display panel according to one embodiment of the present disclosure.
Figure 7:
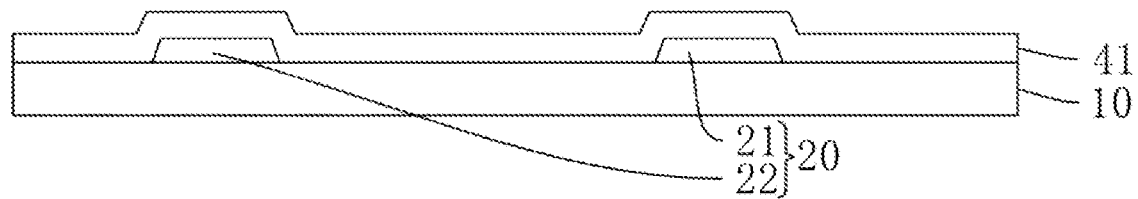
FIGS. 7 to 12 are schematic diagrams of the process structure of the display panel according to one embodiment of the present disclosure.
Figure 8:
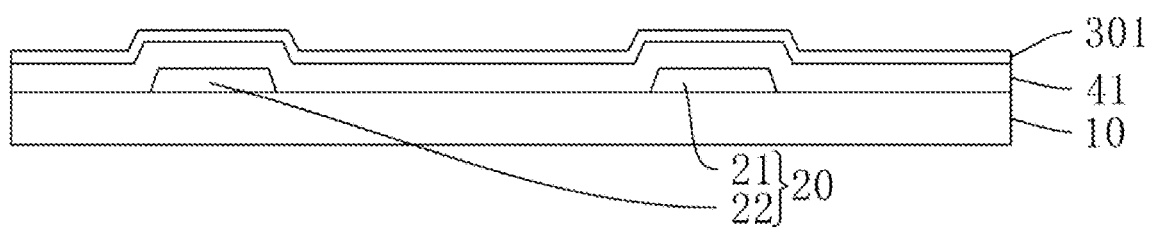
Figure 9:
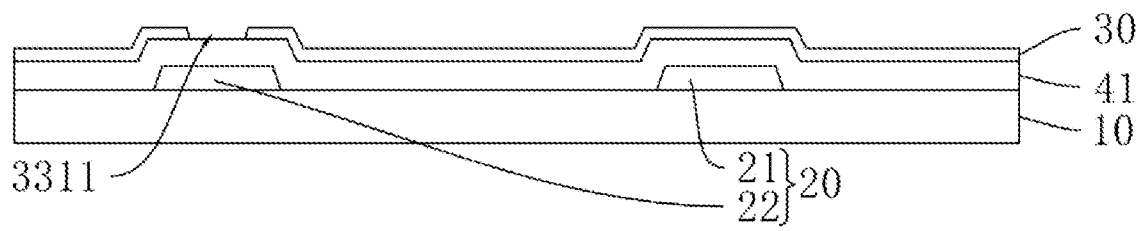
Figure 10:
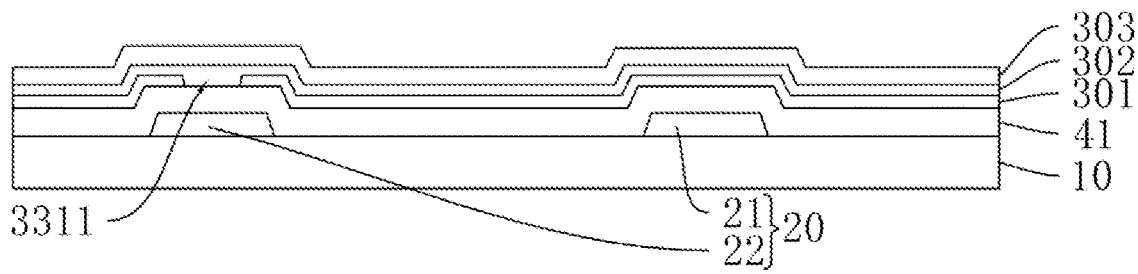
Figure 11:
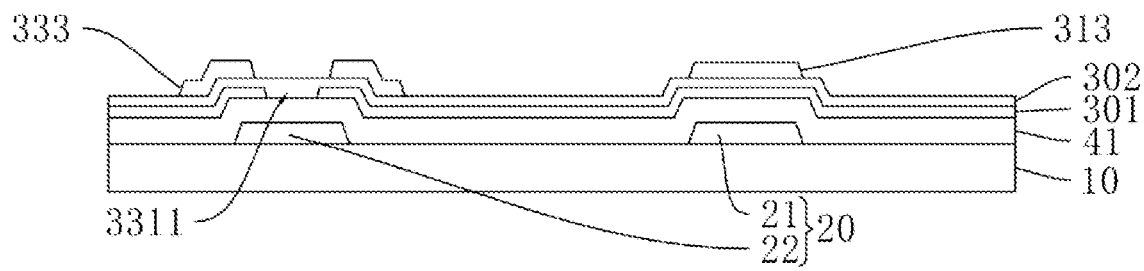
Figure 12:
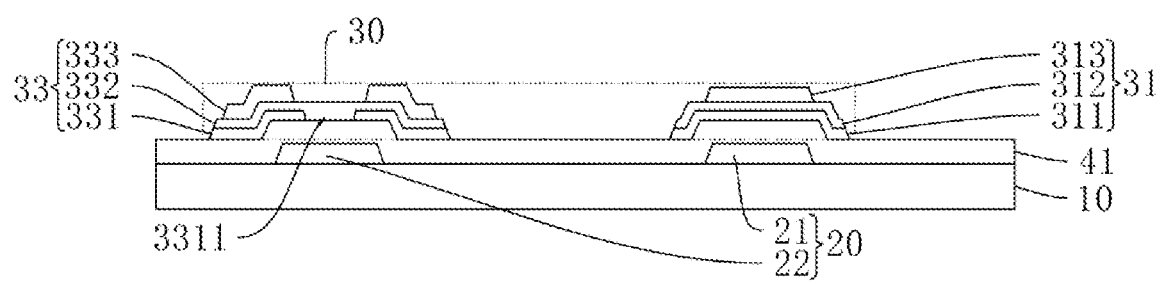

Please refer to FIGS. 1, 3, and 4. The display panel according to one embodiment of the present disclosure further comprises the substrate 10, a counter substrate 44, and a liquid crystal layer 45 disposed between the substrate 10 and the counter substrate 44. The display panel also comprises the first conductive layer 20 disposed on one side of the substrate 10 close to the liquid crystal layer 45, an insulation layer 41 covering the first conductive layer 20, the second conductive layer 30 disposed on one side of the insulation layer 41 close to the liquid crystal layer 45, a spacer layer 42 covering the second conductive layer 30, and a pixel electrode 51 disposed on one side of the spacer layer 42 close to the liquid crystal layer 45. Moreover, the display panel also comprises a common electrode layer 52 disposed on one side of the counter substrate 44 close to the liquid crystal layer 45.

The first conductive layer 20 comprises a first electrode plate 21, a gate 22, and a common voltage signal line (not shown in the figures) connected to the first electrode plate 21. The insulation layer 41 covers the first electrode plate 21 and the gate 22. The second conductive layer 30 comprises a second electrode plate 31 and a transistor 33. The transistor 33 comprises a source, a drain, and an active layer. The second electrode plates 31 is disposed above the first electrode plate 21 to form a storage capacitor. The source, drain, and active layer are disposed above the gate to form a driving thin film transistor. The pixel electrode 51 is connected to the driving thin film transistor through a via by the spacer layer 42 to transmit electrical signal and realize the display function of the display panel.

In addition, the second conductive layer 30 also comprises a data line 32. The data lines 32 is connected to the second electrode plate 31. The data line 32 is connected to the source of the driving thin film transistor to transmit the data signal. The driving thin film transistor further transmits the electrical signal to the pixel electrode 51 to form an electric field with the common electrode layer 52, in order to control the deflection of liquid crystal molecules in the liquid crystal layer 45 and realize the display function of the display panel.

The first electrode plate 21 corresponds to the second electrode plate 31 to form the storage capacitor. The second electrode plates 31 comprises a first additional conductive sublayer 311, a first semiconductor sublayer 312, and a first metal sublayer 313 stacked. The first semiconductor sublayer 312 is located on one side of the first additional conductive sublayer 311 away from the first electrode plate 21, the first metal sublayer 313 is located on one side of the first semiconductor sublayer 312 away from the first additional conductive sublayer 311, and the first metal sublayer 313 is electrically connected with the first additional conductive sublayer 311. The first additional conductive sublayer 311 is relatively disposed with the first electrode plate 21, so that the first additional conductive sublayer 311 and the first metal sublayer 313 maintain the same potential. The capacitance formed between the first electrode plate 21 and the second electrode plate 31 is the capacitance formed between the first electrode plate 21 and the first additional conductive sublayer 311, thereby improving the stability of the capacitance.

Further, the data line 32 comprises a second additional conductive sublayer 321 disposed on one side of the first conductive layer 20 away from the substrate 10, a second semiconductor sublayer 322, and a second metal sublayer 323 stacked. The second semiconductor sublayer 322 is disposed on one side of the second additional conductive sublayer 321 away from the first conductive layer 20, the second metal sublayer 323 is disposed on one side of the second semiconductor sublayer 322 away from the second additional conductive sublayer 321, and the second additional conductive sublayer 321 is electrically connected with the second metal sublayer 323.

The second electrode plate 31 is connected to the data line 32. The first additional conductive sublayer 311 of the second electrode plate 31 is connected to the second additional conductive sublayer 321 of the data line 32. The first semiconductor sublayer 312 of the second electrode plate 31 is connected to the second semiconductor sublayer 322 of the data line 32. The first metal sublayer 313 of the second electrode plate 31 is connected to the second metal sublayer 323 of the data line 32.

Please refer to FIGS. 1 and 3 to 5. The display panel comprises a display area 101 and a non-display area 102 adjacent to the display area 101. The data lines 32 is connected to the second electrode plate 31 in the display area 101 and partially extends into the non-display area 102. The data line 32 further comprises a via 3201 disposed between the second metal sublayer 323 and the second additional conductive sublayer 321 and located in the non-display area 102. The via 3201 passes through the second semiconductor sublayer 322. The second metal sublayer 323 is connected to the second additional conductive sublayer 321 through the via 3201, so as to realize the electrical connection between the second metal sublayer 323 and the second additional conductive sublayer 321. Because the second additional conductive sublayers 321 is connected to the first additional conductive sublayer 311, and the second metal sublayers 323 is connected to the first metal sublayer 313, the electrical connection between the first metal sublayer 313 and the first additional conductive sublayer 31 of the second electrode plate 31 is realized. Accordingly, the first metal sublayer 313 and the first additional conductive sublayer 311 maintain the same potential.

The material of the first additional conductive sublayer 311 is the same as that of the second additional conductive sublayer 321, the material of the first semiconductor sublayer 312 is the same as that of the second semiconductor sublayer 322, and the material of the first metal sublayer 313 is the same as that of the second metal sublayer 323. Further, the first additional conductive sublayer 311 and the second additional conductive sublayer 321 may be the same layer and integrally formed structure, the first semiconductor sublayer 312 and the second semiconductor sublayer 322 may be the same layer and integrally formed structure, and the first metal sublayer 313 and the second metal sublayer 323 may be the same layer and integrally formed structure.

In addition, the transistor 33 comprises a third additional conductive sublayer 331, a third semiconductor sublayer 332, and a third metal sublayer 333 stacked. The third semiconductor sublayer 332 is located on one side of the third additional conductive sublayer 331 away from the first conductive layer 20. The third metal sublayer 333 is located on one side of the third semiconductor sublayer 332 away from the third additional conductive sublayer 331. The stacked third additional conductive sublayer 331 and the third semiconductor sublayer 332 constitute the active layer of the driving thin film transistor. The third metal sublayer 333 is located on the third semiconductor sublayer 332 and on both sides of the third semiconductor sublayer 332 to form the source and drain of the driving thin film transistor 11111. Further, the third additional conductive sublayer 331 comprises a first sub portion 331a, a second sub portion 331b, and a trench 3311 disposed between the first sub portion 331a and the second sub portion 331b. An orthographic projection of the trench 3311 on the substrate 10 is located between an orthographic projection of the corresponding source on the substrate 10 and the orthographic projection of the drain on the substrate 10, that is, the third additional conductive sublayer 331 corresponding to the active layer is separated at the trench, so as to avoid affecting the electrical property and use of the driving thin film transistor due to the conduction of the third additional conductive sublayer 331 of the active layer during the use of the driving thin film transistor.

The pixel electrode 51 is connected with the drain passing through the spacer layer 42. The source of the driving thin film transistors is connected with the data line 32. The second metal sublayer 323 of the data lines 32 is connected to the third metal sublayer 333 of the source. The second semiconductor sublayer 322 of the data line 32 is connected to the third semiconductor sublayer 332 of the active layer, and the second additional conductive sublayer 321 of the data line 32 is connected to the first portion or second portion of the active layer. Due to the first portion and second portion arranged in intervals, the data line 32 can transmit the data signal to the third metal sublayer 333 (i.e. the source) through the second metal sublayer 323.

The material of the third additional conductive sublayer 331 is the same as that of the second additional conductive sublayer 321, the material of the third semiconductor sublayer 332 is the same as that of the second semiconductor sublayer 322, and the material of the third metal sublayer 333 is the same as that of the second metal sublayer 323. Further, the third additional conductive sublayer 331 and the second additional conductive sublayer 321 may be the same layer and integrally formed structure, the third semiconductor sublayer 332 and the second semiconductor sublayer 322 may be the same layer and integrally formed structure, and the third metal sublayer 333 and the second metal sublayer 323 may be the same layer and integrally formed structure.

The materials of the first additional conductive sublayer 311, the second additional conductive layer 321, and the third additional conductive sublayer 331 may all be transparent conductive materials, such as indium tin oxide (ITO) materials. The materials of the first semiconductor sublayer 312, the second semiconductor sublayer 322, and the third semiconductor sublayer 332 may all be amorphous silicon materials. For example, the first semiconductor sublayer 312, the second semiconductor sublayer 322, and the third semiconductor sublayer 332 can all be at least one a-Si film. The materials of the first metal sublayer 313, the second metal sublayer 323, and the third metal sublayer 333 may all be metal materials, such as copper, aluminum, silver, molybdenum, titanium, magnesium, etc.

To sum up, the first additional conductive sublayer 311, on one side of the first semiconductor sublayer 312 of the second electrode plate 31 close to the first conductive layer 20, is connected with the first metal sublayer 313. The first additional conductive sublayer 311 can maintain the same potential as the first metal sublayer 313. The distance between the first electrode plate 21 and the second electrode plate 31 is the same as the distance between the first electrode plate 21 and the first additional conductive sublayer 311. Because there is no semiconductor layer disposed between the first additional conductive sublayer 311 and the first electrode plate 21, the capacitance between the first electrode plate 21 and the second electrode plate 31 will not fluctuate due to the change of semiconductor electrical property, improving the signal stability of the capacitance in the display panel, and thereby avoiding the occurrence of signal crosstalk to improve the display effect of the display panel.

In addition, an embodiment of the present disclosure is also directed to a manufacturing method of a display panel, and the display panel is the display panel described in the above embodiments. Specifically, please refer to FIGS. 1, 3 to 6, and 7 to 12. The manufacturing method of the display panel comprises the steps S10 and S20.

S10: Form a first conductive layer 20 on one side of a substrate 10. The first conductive layer 20 comprises a plurality of first electrode plate 21.

A first metal layer is formed on the substrate 10, which is patterned to obtain a plurality of first electrode plate 21, a plurality of gate 22, and a common voltage signal line connecting the first electrode plate 21 to form the first conductive layer 20.

S20: Form a second conductive layer 30 on one side of the first conductive layer 20 away from the substrate 10. The second conductive layer 30 comprises a second electrode plate 31. The second electrode plates 31 is disposed corresponding to the first electrode plate 21. The second electrode plates 31 comprises a first additional conductive sublayer 311, a first semiconductor sublayer 312, and a first metal sublayer 313 stacked. The first semiconductor sublayer 312 is disposed on one side of the first additional conductive sublayer 311 away from the first conductive layer 20. The first metal sublayer 313 is disposed on one side of the first semiconductor sublayer 312 away from the first additional conductive sublayer 311. The first metal sublayer 313 is connected with the first additional conductive sublayer 311.

An insulation layer 41 is formed on the substrate 10 and covers the first electrode plate 21 and the gate 22. The insulation layer may be a silicon nitride film or a silicon oxide film.

A conductive material layer 301 is formed on the insulation layer 41. A part of the film layer above the gate of the conductive material layer 301 is etched and removed to form a trench 3311 where a channel of the driving thin film transistor can be formed. The material of the conductive material layer may be a transparent conductive material, such as indium tin oxide (ITO) material.

A semiconductor layer 302 and a second metal layer 303 are formed on the conductive material layer 301 in turn. Optionally, the material of the semiconductor layer 302 comprises amorphous silicon material, and the material of the second metal layer 303 comprises metal material, such as copper, aluminum, silver, molybdenum, titanium, magnesium, etc.

Next, the second metal layer 303 may be patterned by wet-etch process to obtain a first metal sublayer 313 located above the first electrode plate 21, a third metal sublayer 333 located above the gate 22, and a second metal sublayer 323 connected to the first metal sublayer 313 and the third metal sublayer 333.

Then, the semiconductor layer 302 and the conductive material layer 301 can be patterned together by dry-etch process to obtain the first semiconductor sublayer 312 disposed between the first electrode plate 21 and the first metal sublayer 313, the first additional conductive sublayer 311 disposed between the first electrode plate 21 and the first semiconductor sublayer 312, the third semiconductor sublayer 332 disposed between the gate 22 and the third metal sublayer 333, a third additional conductive sublayer 331 disposed between the gate 22 and the third semiconductor sublayer 332, a second semiconductor sublayer 322 disposed between the first conductive layer 20 and the second metal sublayer 323, and a second additional conductive sublayer 321 disposed between the first conductive layer 20 and the second semiconductor sublayer 322 to form the second conductive layer 30.

The first additional conductive sublayer 311, the first semiconductor sublayer 312 and the first metal sublayer 313 are stacked to form the second electrode plate 31. The second additional conductive sublayer 321, the second semiconductor sublayer 322 and the second metal sublayer 323 are stacked to form the data line 32. The third additional conductive sublayer 331 and the third semiconductor sublayer 332 are stacked to form the active layer. The third metal sublayer 333 is located on both sides of the active layer to form the source and drain. The driving thin film transistor is composed of the gate 22, the active layer, the source, and the drain.

A spacer layer 42 is formed on the second conductive layer 30 to cover the second conductive layer 30. A plurality of pixel electrodes 51 are formed on the spacer layer 42, each of which is overlapped with the drain of the driving thin film transistor through a via passing through the spacer layer 42.

A common electrode layer 52 is formed on a counter substrate 44. Then, the counter substrate 44 is aligned with the substrate 10, and liquid crystal is injected between the counter substrate 44 and the substrate 10 to form a liquid crystal layer 45 to obtain the display panel.

The embodiments of the present disclosure only show and explain part of the film layer and structure of the display panel. For example, the display panel also comprises a color film layer disposed on the substrate 10 or the counter substrate 44, a black matrix layer disposed on the counter substrate 44, an alignment film disposed on one side of the common electrode layer 52 close to the liquid crystal layer 45 and on one side of the pixel electrode 51 close to the liquid crystal layer 45, and a frame glue disposed around the liquid crystal layer 45. These film layers and structures mentioned above can be realized by referring to conventional means, which will not be repeated here.

In addition, an embodiment of the present disclosure is also directed to a display device, which comprises the display panel described in the above embodiments and a backlight module which is disposed on one side of the display panel.

To sum up, the first additional conductive sublayer 311, on one side of the first semiconductor sublayer 312 of the second electrode plate 31 close to the first conductive layer 20, is connected with the first metal sublayer 313. The first additional conductive sublayer 311 can maintain the same potential as the first metal sublayer 313. The distance between the first electrode plate 21 and the second electrode plate 31 is the same as the distance between the first electrode plate 21 and the first additional conductive sublayer 311. Because there is no semiconductor layer disposed between the first additional conductive sublayer 311 and the first electrode plate 21, the capacitance between the first electrode plate 21 and the second electrode plate 31 will not fluctuate due to the change of semiconductor electrical property, improving the signal stability of the capacitance in the display panel, and thereby avoiding the occurrence of signal crosstalk to improve the display effect of the display panel.

In the above-mentioned embodiments, the description of each embodiment has its own emphasis. For parts that are not described in detail in a certain embodiment, reference may be made to the relevant descriptions of other embodiments.

A display panel and a manufacturing method thereof provided by the embodiments of the present disclosure have been described in detail above. The principles and implementations of the present disclosure are described with specific examples in this article. The technical solution of the present disclosure and its core idea. Those of ordinary skill in the art should understand that: it can still modify the technical solutions recorded in the foregoing embodiments, or perform equivalent replacements to some of the technical features. These modifications or substitutions do not make the essence of the corresponding technical solutions deviate from the scope of the technical solutions of the embodiments of the present disclosure.

What is claimed is:

1. A display panel, comprising:
a substrate;
a first conductive layer, disposed on one side of the substrate and comprising a first electrode plate; and
a second conductive layer, disposed on one side of the first conductive layer away from the substrate and arranged at interval with the first conductive layer, wherein the second conductive layer comprises a second electrode plate disposed corresponding to the first electrode plate;
wherein the second electrode plate comprises:
a first additional conductive sublayer;
a first semiconductor sublayer, disposed on one side of the first additional conductive sublayer away from the first conductive layer; and
a first metal sublayer, disposed on one side of the first semiconductor sublayer away from the first additional conductive sublayer, and connected with the first additional conductive sublayer,
wherein the second conductive layer further comprises a data line, the data line comprising:
a second additional conductive sublayer;
a second semiconductor sublayer, disposed on one side of the second additional conductive sublayer away from the first conductive layer; and
a second metal sublayer, disposed on one side of the second semiconductor sublayer away from the second additional conductive sublayer, and connected with the second metal sublayer.

2. The display panel as claimed in claim 1, wherein the second electrode plate is connected to the data line; the first additional conductive sublayer of the second electrode plate is connected to the second additional conductive sublayer of the data line; the first semiconductor sublayer of the second electrode plate is connected to the second semiconductor sublayer of the data line; the first metal sublayer of the second electrode plate is connected to the second metal sublayer of the data line.

3. The display panel as claimed in claim 2, further comprising a display area and a non-display area adjacent to the display area, wherein the data line is connected to the second electrode plate in the display area and partially extends into the non-display area; the data line further comprises a via that is disposed between the second metal sublayer and the second additional conductive sublayer and located in the non-display area; the second metal sublayer is connected with the second additional conductive sublayer through the via.

4. The display panel as claimed in claim 2, wherein a material of the first additional conductive sublayer is the same as a material of the second additional conductive sublayer, a material of the first semiconductor sublayer is the same as a material of the second semiconductor sublayer, and a material of the first metal sublayer is the same as a material of the second metal sublayer.

5. The display panel as claimed in claim 1, wherein the second conductive layer further comprises:
    an active layer, comprising a third additional conductive sublayer and a third semiconductor sublayer that is disposed on one side of the third additional conductive sublayer away from the first conductive layer;
    a source, disposed on the active layer; and
    a drain, disposed on the active layer;
    wherein each of the source and the drain comprise a third metal sublayer disposed on the third semiconductor sublayer.

6. The display panel as claimed in claim 5, wherein the third additional conductive sublayer comprises:
    a first sub portion;
    a second sub portion, separated from the first sub portion; and
    a trench, disposed between the first sub portion and the second sub portion,
wherein an orthographic projection of the trench on the substrate is located between an orthographic projection of the source on the substrate and an orthographic projection of the drain on the substrate.

7. The display panel as claimed in claim 6, wherein the second metal sublayer of the data line is connected to the third metal sublayer of the source, the second semiconductor sublayer of the data line is connected to the third semiconductor sublayer of the active layer, and the second additional conductive sublayer of the data line is connected to the first portion or the second portion of the active layer.

8. The display panel as claimed in claim 5, wherein the first conductive layer further comprises a gate, disposed between the substrate and the second conductive layer, and wherein the source, the drain, the active layer are disposed on one side of the gate away from the substrate, and the first electrode plate is relatively disposed with the first additional conductive sublayer.

9. A method for manufacturing a display panel, comprising:
    forming a first conductive layer on one side of a substrate, wherein the first conductive layer comprises a first electrode plate;
    forming a second conductive layer on one side of the first conductive layer away from the substrate, wherein the second conductive layer, arranged at interval with the first conductive layer, comprises a second electrode plate corresponding to the first electrode plate, and wherein the second electrode plate comprises a first additional conductive sublayer, a first semiconductor sublayer disposed on one side of the first additional conductive sublayer away from the first conductive layer, and a first metal sublayer that is disposed on one side of the first semiconductor sublayer away from the first additional conductive sublayer, and connected with the first additional conductive sublayer,
    wherein the second conductive layer further comprises a data line, the data line comprising:
    a second additional conductive sublayer;
    a second semiconductor sublayer, disposed on one side of the second additional conductive sublayer away from the first conductive layer; and
    a second metal sublayer, disposed on one side of the second semiconductor sublayer away from the second additional conductive sublayer, and connected with the second metal sublayer.

10. The method as claimed in claim 9, wherein the second electrode plate is connected to the data line; the first additional conductive sublayer of the second electrode plate is connected to the second additional conductive sublayer of the data line; the first semiconductor sublayer of the second electrode plate is connected to the second semiconductor sublayer of the data line; the first metal sublayer of the second electrode plate is connected to the second metal sublayer of the data line.

11. The method as claimed in claim 10, wherein the display panel further comprises a display area and a non-display area adjacent to the display area, wherein the data line is connected to the second electrode plate in the display area and partially extends into the non-display area; the data line further comprises a via that is disposed between the second metal sublayer and the second additional conductive sublayer and located in the non-display area; the second metal sublayer is connected with the second additional conductive sublayer through the via.

12. The method as claimed in claim 10, wherein a material of the first additional conductive sublayer is the same as a material of the second additional conductive sublayer, a material of the first semiconductor sublayer is the same as a material of the second semiconductor sublayer, and a material of the first metal sublayer is the same as a material of the second metal sublayer.

13. The method as claimed in claim 9, wherein the second conductive layer further comprises:
    an active layer, comprising a third additional conductive sublayer and a third semiconductor sublayer that is disposed on one side of the third additional conductive sublayer away from the first conductive layer;
    a source, disposed on the active layer; and
    a drain, disposed on the active layer;
    wherein each of the source and the drain comprise a third metal sublayer disposed on the third semiconductor sublayer.

14. The method as claimed in claim 13, wherein the third additional conductive sublayer comprises:
    a first sub portion;
    a second sub portion, separated from the first sub portion; and
    a trench, disposed between the first sub portion and the second sub portion,
wherein an orthographic projection of the trench on the substrate is located between an orthographic projection of the source on the substrate and an orthographic projection of the drain on the substrate.

15. The method as claimed in claim 14, wherein the second metal sublayer of the data line is connected to the third metal sublayer of the source, the second semiconductor sublayer of the data line is connected to the third semiconductor sublayer of the active layer, and the second additional conductive sublayer of the data line is connected to the first portion or the second portion of the active layer.

16. The method as claimed in claim 13, wherein the first conductive layer further comprises a gate, disposed between the substrate and the second conductive layer, and wherein the source, the drain, the active layer are disposed on one side of the gate away from the substrate, and the first electrode plate is relatively disposed with the first additional conductive sublayer.

* * * * *